United States Patent
Tran et al.

(10) Patent No.: US 9,257,403 B2
(45) Date of Patent: Feb. 9, 2016

(54) COPPER BALL BOND INTERFACE STRUCTURE AND FORMATION

(71) Applicant: Freescale Semiconductor, Inc., Austin, TX (US)

(72) Inventors: Tu-Anh N. Tran, Austin, TX (US); John G. Arthur, Austin, TX (US); Yin Kheng Au, Petaling Jaya (MY); Chu-Chung Lee, Round Rock, TX (US); Chin Teck Siong, Shah Alam (MY); Meijiang Song, Tianjin (CN); Jia Lin Yap, Klang (MY); Matthew J. Zapico, Cedar Park, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 165 days.

(21) Appl. No.: 14/090,086

(22) Filed: Nov. 26, 2013

(65) Prior Publication Data

US 2015/0145148 A1    May 28, 2015

(51) Int. Cl.
*H01L 23/00* (2006.01)

(52) U.S. Cl.
CPC ............... *H01L 24/13* (2013.01); *H01L 24/45* (2013.01); *H01L 24/81* (2013.01); *H01L 24/85* (2013.01); *H01L 2224/13147* (2013.01); *H01L 2224/45015* (2013.01); *H01L 2224/45144* (2013.01); *H01L 2224/45147* (2013.01); *H01L 2224/85205* (2013.01); *H01L 2224/85345* (2013.01); *H01L 2924/181* (2013.01)

(58) Field of Classification Search
CPC ......... H01L 24/13; H01L 24/81; H01L 24/85; H01L 24/45; H01L 2224/45147; H01L 2224/13147; H01L 2224/85345
See application file for complete search history.

(56) References Cited

U.S. PATENT DOCUMENTS

2010/0007009 A1*  1/2010  Chang et al. ............... 257/692
2012/0074206 A1*  3/2012  Qin et al. ................... 228/102

OTHER PUBLICATIONS

Hui Xu et al., Growth of Intermetallic Compounds in Thermosonic Copper Wire Bonding on Aluminum Metallization, Journal of Electronic Materials, vol. 39, No. 1, 2010.
Coorstek, Inc., Gaiser Product Group, Precision Bonding Tools, Capillary Wire Bonding, http://www.nordson.com/de-de/divisions/dage/products/materialien/CoorsTek/Documents/CoorsTek_StdCap.pdf, printed Nov. 26, 2013.
Y. H. Lu et al., Growth of CuAl Intermetallic Compounds in Cu and Cu(Pd) Wire Bonding, 2011 Electronic Components and Technology Conference, 2011.
Timothy W. Ellis et al., Advanced Bonding, Copper Wire Bonding, SEMICON Singapore 2000, the Millennium Conference, May 10, 2000.
John D. Beleran et al., Effects of Bond Pad Probing for Cu Wire Bond Packages, 2013 Electronic Components & Technology Conference, 2013.

(Continued)

*Primary Examiner* — David Vu
(74) *Attorney, Agent, or Firm* — Terrile, Cannatti, Chambers & Holland, LLP; Michael Rocco Cannatti

(57) ABSTRACT

An integrated circuit copper wire bond connection is provided having a copper ball (32) bonded directly to an aluminum bond pad (31) formed on a low-k dielectric layer (30) to form a bond interface structure for the copper ball characterized by a first plurality of geometric features to provide thermal cycling reliability, including an aluminum minima feature (Z1, Z2) located at an outer peripheral location (42) under the copper ball to prevent formation and/or propagation of cracks in the aluminum bond pad.

20 Claims, 9 Drawing Sheets

(56) References Cited

OTHER PUBLICATIONS

Charles J. Vath, III et al., Elsevier, Factors affecting the long-term stability of Cu/Al ball bonds subjected to standard and extended high temperature storage, Microelectronics Reliability 51 (2011) 137-147.

Leo M. Higgins, III et al., U.S. Appl. No. 13/594,732, filed Aug. 24, 2012, entitled Copper Ball Bond Features and Structure.

* cited by examiner

US 9,257,403 B2

COPPER BALL BOND INTERFACE STRUCTURE AND FORMATION

BACKGROUND OF THE INVENTION

1. Field of the Invention

The present invention is directed in general to semiconductor devices and methods for manufacturing same. In one aspect, the present invention relates to wire ball bonding and associated methods of fabricating and testing same.

2. Description of the Related Art

Ball bonding is widely employed in the semiconductor packaging industry to form electrical connections between an integrated circuit die and a die carrier such as a lead frame or a substrate. Conventional ball bonding processes use a combination of heat, pressure and ultrasonic energy to form an intermetallic connection or weld between a wire and a connection pad, typically forming a u-shaped bond interface with the thinnest portion of the connection pad being centrally located under the wirebond. However, the connection pad is typically subjected to a number of stressors such as temperature cycling, impact force, contact power, contact force, bond power and bond force during the ball bonding process, leading to mechanical integrity problems, such as cracks between the connection pad and bonding ball that can form during bonding, device operation or device testing, such as highly accelerated stress test (HAST). For example, accumulated stress due to coefficient of thermal expansion (CTE) mismatch in temperature cycling situations can exceed the aluminum strength, causing aluminum fatigue and aluminum cracking underneath copper ball bonds. While such stress effects are mitigated somewhat with conventional copper ball bonds formed with large ball bond structures (e.g., wire diameters larger than 50 microns and ball diameters larger than 100 microns) formed on high-k dielectric layers in short interconnect stacks (e.g., 1-2 BEOL interconnect levels) without active circuits located beneath the bond structure, such conventional copper ball bond structures are extremely difficult at a practical level to use with state of the art devices.

BRIEF DESCRIPTION OF THE DRAWINGS

The present invention may be understood, and its numerous objects, features and advantages obtained, when the following detailed description is considered in conjunction with the following drawings, in which.

Figure 1:
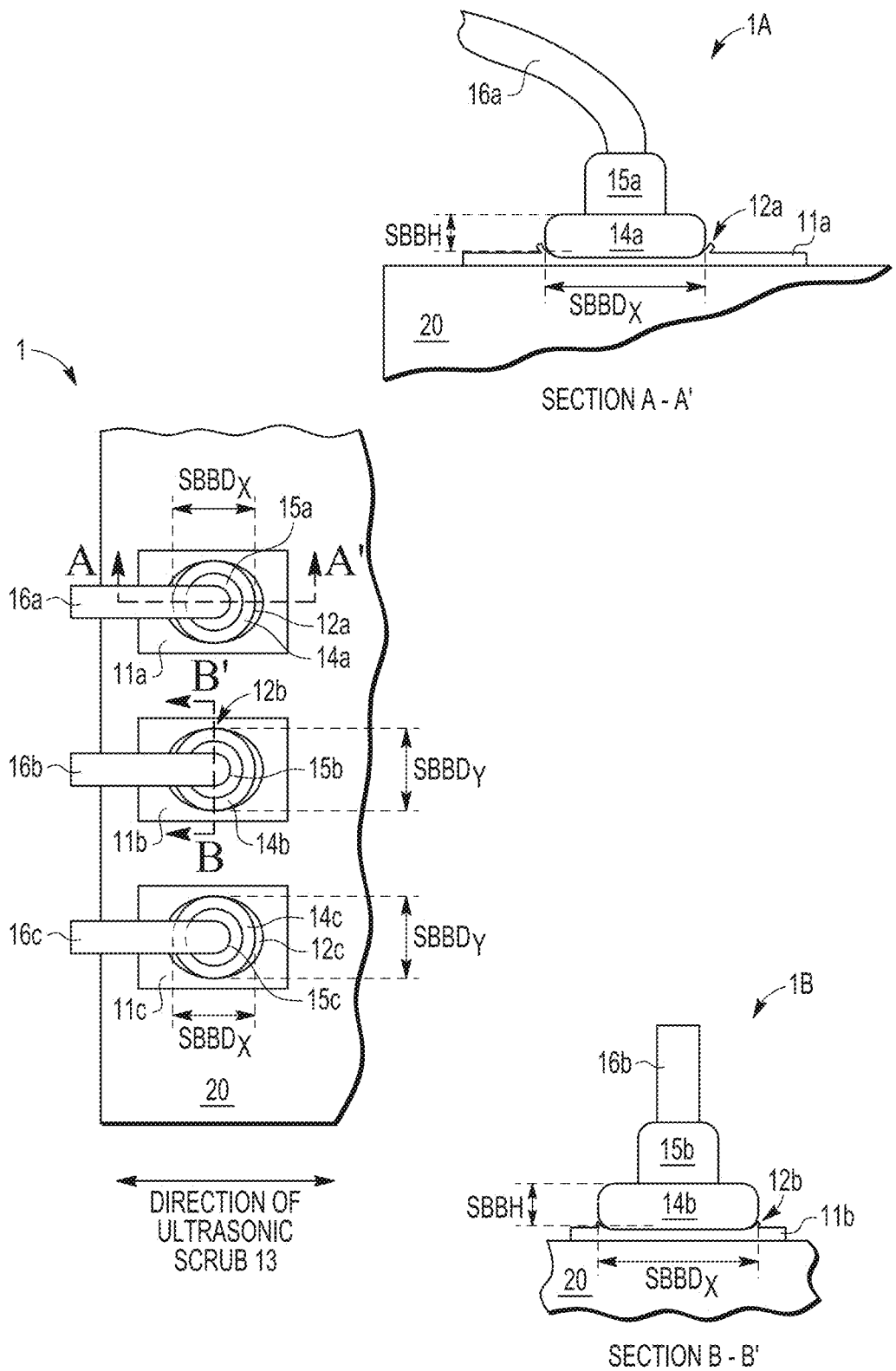
FIG. 1 is a top plan view of a semiconductor die edge having copper wirebonds affixed to bond pads, along with enlarged front and side views of a copper wirebond and bond pad structure in accordance with selected embodiments.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for forming reliable copper ball bonds on aluminum pads formed on low-k dielectric layers to prevent metallic cracking underneath a copper ball wirebond after temperature cycling by controlling selected bonding parameters to form intermetallic connections meeting a plurality of specified structural and geometric requirements, such as the relative modulus values of the bond materials, the positioning, thickness and symmetry of the minimum remnant aluminum layers beneath the bonded copper ball, the relative width or length of the intermetallic contact area and/or a specified height-to-diameter ratio for the squashed ball to increase an average ball shear strength per ball area test measure. In selected embodiments, the specified structural and geometric requirements are used when there is a threshold modulus mismatch between the aluminum-based connection pad material and the interconnecting bond material. For example, a threshold modulus mismatch occurs when a connection pad is formed with a metallic material having a modulus measure of stiffness (e.g., Young's modulus, E) that is less than or equal to a predetermined percentage (e.g., 60%) of the modulus measure of the interconnecting material (e.g., E of Al, Al alloy~65 GPa, E of $CuAl_2$~123 GPa and E of Cu of 117 GPa). With such a modulus mismatch, reliable copper ball bonds may be fabricated by controlling the bonding parameters to form a connection pad layer or inter-metallic compound (IMC) layer with a minima feature (e.g., aluminum remnant) that is located in or past the outer half of the chamfer-squeezed region at a high stress connection point to have specified maximum remnant thickness (e.g., $T_{REMNANT}$=0.1-0.2 um). By minimizing the thickness of the remnant aluminum layer at the periphery of the copper ball bond and converting low-modulus aluminum to a higher-modulus IMC layer, temperature cycling induced fatigue and cracks in the aluminum are reduced. An additional geometrical requirement for promoting reliable copper ball bonds is to form copper wirebonds with substantial symmetry between remnant connection pad layer thicknesses on first and second opposed sides of a squashed copper ball bond (e.g., $T_{REMNANT-1}/T_{REMNANT-2} \geq 0.7$). To prevent aluminum cracking beneath the copper ball, the bonding parameters may also be controlled to form an extended intermetallic contact area relative to the squashed ball bond area by requiring that the intermetallic contact length meet a predetermined percentage (e.g., 65-80%) of the squashed ball bond diameter, thereby ensuring a large contact area for IMC growth. Copper ball bonding reliability is also promoted by controlling the squashed ball height ($H_B$) to be less than or equal to a predetermined percentage (e.g., 35%) of the squashed ball width ($H_W$), thereby forming a short and fat squashed ball. To evaluate the bond strength, a ball shear strength/area measure is determined by performing ball shear tests on a plurality of squashed ball bonds and dividing the average ball shear force by the average area of the squashed ball bonds, where reliable copper ball bonds have a ball shear strength/area measure that meets or exceeds a minimum threshold value (e.g., 7.5-9 gf/mil$^2$). The geometric structural features described hereinbelow apply to copper ball bonds displayed in cross-sections through the center of copper ball bonds where the cross-sections were made in the direction parallel to the direction of ultrasonic vibration. As disclosed herein, the bonding parameters may be controlled to achieve temperature cycling reliability to meet a variety of established test criteria, such as the Automotive Electronics Council (AEC) Q100 Grade 2, Grade 1, or Grade 0 air-to-air temperature cycling test standards.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of an integrated circuit device with a copper wire ball bonded to a connection pad without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, there are references to certain reliability tests that may be performed. Where the specific procedures for performing such or similar reliability tests are not detailed below, conventional techniques to one skilled in the art for performing reliability tests shall be intended. Such details are well known and not considered necessary to teach one skilled in the art of how to make or use the present invention.

Referring now to FIG. 1, there is shown a top plan view 1 of a semiconductor die edge having copper wire bonds affixed to bond pads, along with enlarged front view 1A (along view lines A-A') and side view 1B (along view lines B-B'). As illustrated in the plan view 1, a plurality of bonding sites are formed on an integrated circuit die 20 which may be attached to a die carrier (not shown) having a substrate or a lead frame. As integrated circuit dies, substrates, lead frames, and their respective bonding sites are known to those of ordinary skill in the art, detailed descriptions thereof are not necessary for a full understanding of the invention. On the IC die 20, there is formed one or more connection pads 11a-c, each of which may be formed as sensitive pad structures such as, for example, bond over active (BOA) pad structures, or bond pads formed over a low-k dielectric structure or via design. In selected embodiments, the connection pads 11a-c may have a metal thickness of less than 1.5 μm, but may be ≥2.8 μm in thickness, and may be formed with aluminum (Al) or other electrically conductive material as is known in the art. It should however be understood by those of skill in the art that the present invention is not limited by the type or thickness or material used for the connection pads which will depend on the application.

A plurality of wire ball bond elements 14-16 electrically connects the connection pads 11 to external bonding sites (not shown). Each wire ball bond includes a ball bond portion 14 which is characterized by a squashed ball bond height (SBBH) dimension and a squashed ball bond diameter (SBBD) dimension which may be in an x-direction (SBBD-x) or y-direction (SBBD-y). As illustrated, a first wire bond—including a ball bond contact portion 14a, interconnection portion 15a, and wire conductor portion 16a—is formed and affixed to a first connection pad 11a. Though illustrated as separate portions, it will be appreciated that the wire bond 14-16 is formed as a single, continuous wire bond structure. In similar fashion, a second wire bond (including ball bond contact portion 14b, interconnection portion 15b, and wire conductor portion 16b) is attached to a second connection pad 11b, and a third wire bond (including ball bond contact portion 14c, interconnection portion 15c, and wire conductor portion 16c) is attached to a third connection pad 11c. The wire bonds may be formed with copper (Cu) or other electrically conductive materials known in the art, such as with gold (Au), aluminum (Al), and the like. Though illustrated as separate portions, it will be appreciated that each wire bond may be formed as a single, integrated conductor.

To attach each wire bond to a corresponding connection pad (e.g., 11a, 11b), a controlled ball bonding process uses a specified combination of heat, pressure and ultrasonic energy to form an intermetallic connection or weld between the wire bond and connection pad. In particular, the bonding process is controlled to form splash features 12a-c extending from the connection pad at the base of the ball bond contact portion. As will be appreciated, the splash features 12a-c are formed when material from the connection pad is displaced by the ball bond during the bonding process so that at least part of the splash feature is raised or elevated above the original top surface of the connection pad. To promote reliability, the splash feature should, in some embodiments, be formed around substantially the entire perimeter of the ball bond, though some short breaks in the continuity of the splash feature are acceptable. And in some embodiments, the splash feature should substantially extend to at least the perimeter of the ball bond but should not extend substantially past the perimeter of the ball bond. Depending on the specifics of the ball bonding process, the shape and extent of the splash feature may be different at different parts of the ball bond perimeter. This is shown in the plan view 1 where the side-to-side direction 13 of the wire bond transducer movement during the ultrasonic 'scrub' portion of the Cu ball bonding process creates splash features 12a-c having a lateral extent that is greater in the direction parallel to scrub motion than in the direction perpendicular to the scrub motion. The differences in lateral extent are clearly seen in the enlarged front view 1A of the first wire bond 14-16a and connection pad 11a (along view lines A-A') where the lateral extent of the splash feature 12a formed at the inner and outer segments of the ball bond extends past the perimeter of the ball bond contact portion 14a. In contrast, the enlarged front view 1B of the wire bond 14-16b and connection pad 11b (along view lines B-B') shows that the lateral extent of the splash feature 12b formed at the lateral segments of the ball bond does not quite extend to the perimeter of the ball bond contact portion 14b, but nonetheless provides a minimum amount of splash.

In addition to forming lateral splash features, the wire bonding process forms a squashed ball bond by compressing or squashing the ball bond contact portions 14a-c down against the connection pads 11a-c. As illustrated in simplified form in FIG. 1, the resulting squashed ball bonds 14a-c are characterized by a first lateral dimension measure for the squashed ball bond diameter (SBBD) which may be measured in a first "x" direction ($SBBD_x$) and/or a second "y" direction ($SBBD_y$). In addition, the squashed ball bonds are characterized by a second vertical dimension measure for the squashed ball bond height (SBBH) which is less than the squashed ball bond diameter (SBBD) measure.

Figure 2A:
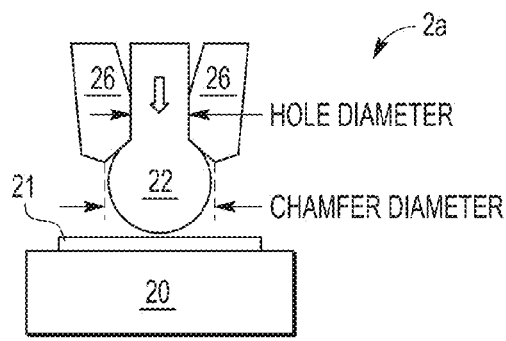
FIGS. 2(a)-(d) schematically illustrate a bonding sequence for bonding a squashed copper wirebond ball to an aluminum connection pad.

To illustrate additional structural details of the constructed geometric features of the wire bonding process and resulting copper ball bond structure, reference is now made to FIGS. 2(a)-(d) which show a typical step-by-step overview of an example wire bonding sequence for bonding a squashed copper wirebond ball to an aluminum connection pad. As shown at FIG. 2(a), the bonding process begins with a threaded capillary 26 that is positioned above aluminum connection pad 21 formed on a substrate structure 20, In particular, the capillary 26 is threaded with a copper wire conductor and ball bond contact 22. In an example sequence, a copper wire conductor is inserted or threaded through a central opening in the capillary having a specified hole diameter, followed by formation of the ball bond contact at the end of the wire conductor, such as by using an electrical flame off (EFO) process to form a free air ball. In the capillary 26, the free air ball portion is captured in capillary's chamfer portion having a specified chamfer diameter.

Figure 2B:
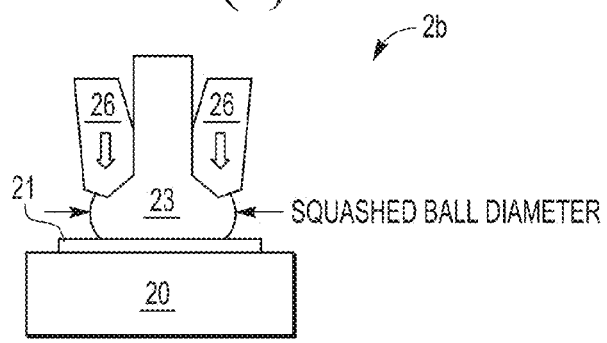

As shown in FIG. 2(b), the capillary 26 with copper wire conductor and ball bond contact descends or moves down to the bond site on the connection pad 21. By applying downward force from the capillary 26 to the connection pad 21 and substrate 20, the copper wire conductor and ball bond contact 23 are deformed to form a squashed ball having a squashed ball diameter that is larger than the diameter of the undeformed free air ball. In addition, the deformation of the ball bond contact leaves an impression deformity in the ball bond contact that corresponds to the shape of the impressed chamfer. In the example, the depicted impression deformity is a v-shaped impression defined by a low point in the upper surface of the squashed ball bond.

Figure 2C:
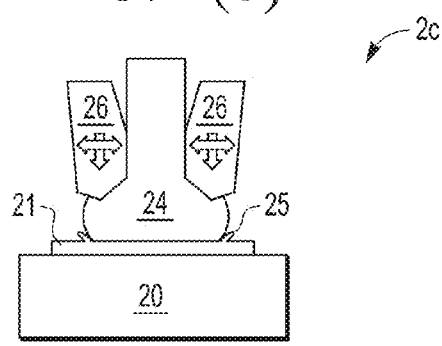

As shown in FIG. 2(c), one or more additional ball bonding processes are applied to complete the bonding of the squashed copper wirebond ball 24 to the connection pad 21. For example, the ball bonding process may include a specified combination of heat, pressure, and ultrasonic energy to form an intermetallic connection or weld between the wire bond 24 and connection pad 21. As indicated by the lateral direction arrows for the ultrasonic vibration, lateral splash features 25 are formed from the material (e.g., aluminum) forming the connection pad 21.

Figure 2D:
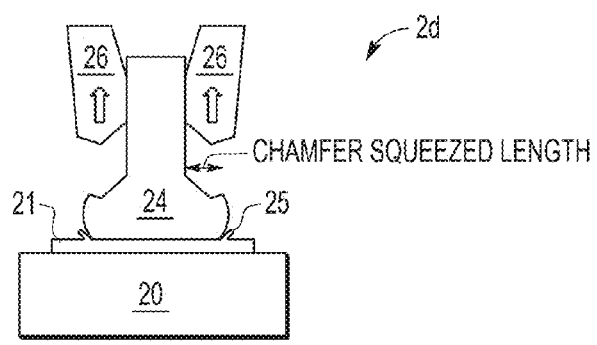

As shown in FIG. 2(d), the capillary 26 is lifted from the substrate, leaving the squashed copper wirebond ball 24 bonded to the connection pad 21. As shown, the squashed copper wirebond ball 24 has a v-shaped impression deformity formed in an upper surface which defines a chamfer squeezed length for the squashed ball bond. As an approximation, the chamfer squeezed length represents the lateral expansion of the copper wirebond ball caused by the compression or squashing of the copper wirebond ball in each peripheral direction. As will be appreciated, FIG. 2(d) shows a simplified representation of the bonding structure formed between the copper wirebond ball 24 and aluminum connection pad 25 without providing structural details of the bonding structure, such as any aluminum displacement under the copper ball, any profile or related dimensional information for the bonding structure layers, or the formation or dimensional information for any intermetallic compound layer formed between the aluminum connection pad 21 and wire bond 24.

Figure 3:
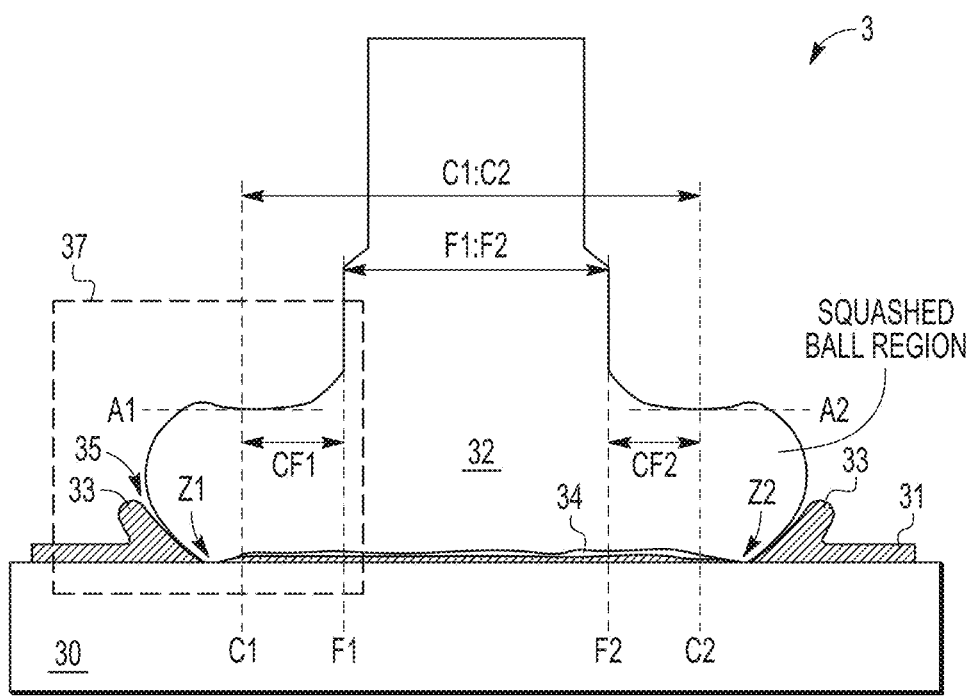
FIG. 3 is a schematic cross section of a copper ball bonded to an aluminum pad showing an aluminum splash and intermetallic contact area having structural geometric features optimized to prevent aluminum cracking under the copper ball in accordance with selected embodiments of the present disclosure.

In reference to FIG. 3, by controlling the bonding process conditions used to form the copper ball 32 bond on the aluminum pad 31 with specified structural geometric features, a reliable and low cost copper ball bond is directly formed between the copper ball 32 and aluminum pad 31 which resists the effects of cyclic stress (e.g., from temperature cycling), such as aluminum fatigue or cracking resulting from accumulated stress due to coefficient of thermal expansion (CTE) mismatch in temperature cycling situations. In addition, the direct bonding of the copper ball 32 to the aluminum pad 31 eliminates the processing complexity and expense of forming Nickel/Palladium/Gold Over Pad Metallization (OPM) layers on the aluminum pad 31 that would otherwise be required to maintain high temperature reliability performance.

To illustrate the construction of structural geometric features for providing thermally reliable copper/aluminum bonds, reference is now made to FIG. 3 which shows a schematic cross section view 3 of a copper ball 32 bonded to an aluminum pad 31 with the resulting aluminum splash features 33 and intermetallic contact layer 34 having optimized structural geometric features to prevent aluminum cracking under the copper ball. The depicted cross-sectional view 3 is through the center of the ball bond 32 and parallel to the direction of the wire bond transducer movement during the ultrasonic scrub portion of the copper ball bonding process. As will be appreciated, the cross-sectional view may be obtained using and desired imaging tool, such as an ion milling or focused ion beam (FIB) technique.

The depicted bonding ball 32 is a deformed ball bond characterized by a chamfer-squeezed length CF1, CF2 on each side. As shown in FIG. 3, the downward bonding force applied to the copper ball bond 32 by the capillary (not shown) deforms and squashes the copper ball bond 32, leaving an impression deformity that corresponds to the shape of the impressed chamfer. In the example, the depicted impression deformity is a u-shaped or j-shaped impression defined by a low point in the upper surface of the squashed ball bond. On each side of the copper ball bond 32, the chamfer-squeezed length CF1, CF2 may be characterized by first measuring horizontal line cutting across the lowest point on top of squashed region of ball (along horizontal line A1, A2), and/or drawing a perpendicular line C1, C2 cutting across the lowest point on top of squashed region of ball. The distance between the perpendicular lines C1:C2 corresponds to the chamfer diameter of the capillary. In addition, vertical lines F1, F2 are drawn down from the top of squashed ball at the point where the surface starts to turn from convex to concave. The distance between the vertical lines F1:F2 corresponds to the hole diameter of capillary. On each side of the copper ball 32, the distance CF1, CF2 between the vertical lines C, F define a chamfer-squeezed length of the squashed ball bond profile.

As described herein, the bond between the copper ball 32 and aluminum pad 31 is formed with one or more specified geometric structural bond features which promote temperature cycling reliability. The disclosed structural bond features are especially useful when there is a threshold modulus mismatch between the aluminum-based connection pad 31 and the overlying inter-metallic compound (IMC) layer or copper ball bond 32. For example, a threshold modulus mismatch occurs when an aluminum connection pad 31 has a modulus measure of stiffness (e.g., E of Al, Al alloy~65 GPa) that is less than or equal to a predetermined percentage (e.g., 60%) of the modulus measure for the copper ball bond 32 (e.g., E of Cu of 117 GPa) or the interconnecting IMC layer (e.g., E of $CuAl_2$~123 GPa). On the other hand, if there is not significant modulus mismatch (e.g., $E_{CONNECTION\,PAD} \geq 60\% E_{BALL}$), one or more of the disclosed structural bond features may not be needed to achieve thermally reliable ball bonds.

Figure 4:
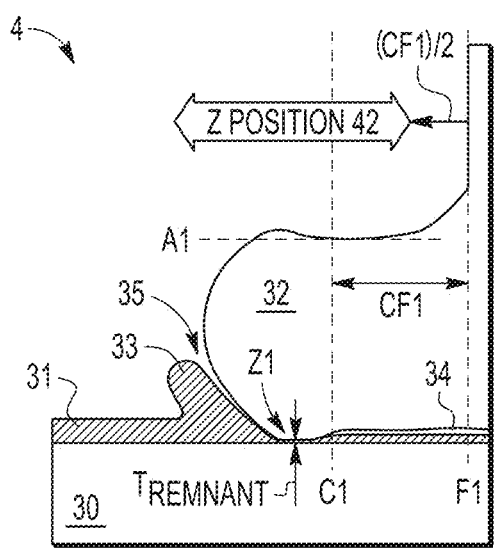
FIG. 4 is an enlarged schematic cross section of selected geometric features of the intermetallic contact area formed at the interface between a copper ball bond and aluminum pad.

In cases where there is a significant modulus mismatch, the bonding parameters may be controlled to form a connection pad layer or inter-metallic compound (IMC) layer with a first structural bond feature whereby a minima feature (e.g., aluminum remnant) is located in or past the outer half of the chamfer-squeezed region CF of the copper ball 32 at a high stress connection point. To illustrate selected embodiments of the minima feature for a reliable copper ball bond, reference is now made to FIG. 4 which shows an enlarged schematic cross section view 4 of the area 37 (shown in FIG. 3) in which are shown selected geometric features of the bond interface structure between the copper ball bond 32 and aluminum pad 31. There are a number of geometric features characterizing the bonding interface structure between the copper ball 32 and aluminum bond pad 31, including an aluminum splash 33 that is formed to define a crevice 35 with the copper ball bond 32. An additional geometric structural feature of the bonding interface structure is the minima location Z1, which is the outermost location at which smallest aluminum remnant layer under the copper ball 32 ball is found. While conventional bonding techniques have recommended that the minima location be centrally located under the copper ball (e.g., under the hole diameter region), selected embodiments of the present disclosure provide improved temperature cycling reliability by forming the copper ball bond so that the minima feature 71 is located in or past the outer half of the chamfer-squeezed region at a high stress connection point. In FIG. 4, this desire positioning of the minima feature Z1 is indicated by the "Z POSITION" arrow 42 which extends from the halfway point (indicated at (CF1)/2) in the chamfer region (indicated at CF1) to extend outward to the outer edge of the copper ball 32.

In addition or in the alternative, the bonding parameters may be controlled to limit the maximum target thickness of the minima feature (e.g., aluminum or IMC remnant) at the high stress connection point Z1. In FIG. 4, the maximum target thickness of the minima feature may be measured between the top of the substrate barrier layer 30 and the bottom of the squashed ball bond 32. As will be appreciated, the measured height may be the remnant thickness ($T_{REMNANT}$) of the aluminum at the minima location Z1, or may instead be the thickness of the Cu—Al IMC layer 34 if the aluminum remnant was converted to an intermetallic compound. To provide a reliable copper ball bond, the thickness of the aluminum remnant layer at the minima location Z1 is kept below a first maximum target thickness (e.g., $T_{REMNANT}$<0.2 um). To achieve an even higher level of temperature cycling reliability performance, such as the Automotive Electronics Council (AEC) Q100 Grade 0 automotive test standards, the thickness of the aluminum remnant layer at the minima location Z1 is kept below a second, smaller maximum target thickness (e.g., $T_{REMNANT}$<0.1 um). In selected embodiments, a highly reliable copper ball bond requires that, on both sides of a ball bond, the minima feature be positioned in or past the outer half of the chamfer region and be limited to a maximum target thickness (e.g., $T_{REMNANT} \leq 0.1$-$0.2$ um), depending on the testing requirements.

Figure 5:
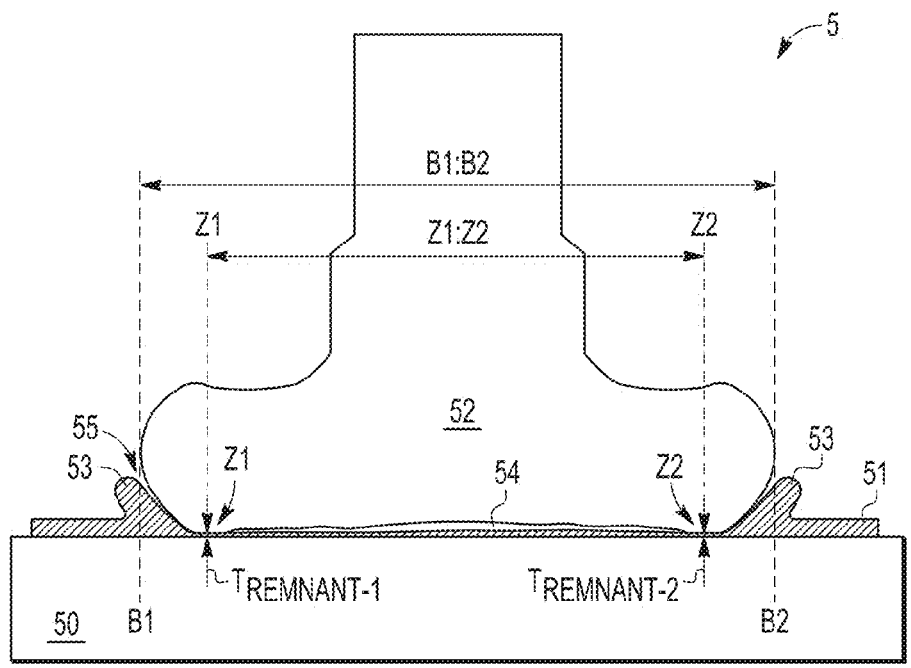
FIGS. 5-6 show schematic cross sections of a copper ball having a first specified shape type that is bonded to an aluminum pad to illustrate structural geometric features optimized to prevent aluminum cracking under the copper ball in accordance with selected embodiments of the present disclosure.

In addition or in the alternative, the bonding parameters may be controlled to provide substantial symmetry between the minima features on opposed sides of the ball bond. In selected example embodiments, the symmetry may be characterized as a specified geometric structural bond feature whereby the thicknesses of the minima features are within a predetermined percentage of one another. To illustrate selected embodiments of the remnant thickness symmetry feature for a reliable copper ball bond, reference is now made to FIG. 5 which shows a schematic cross section view 5 of a copper ball 52 bonded to an aluminum pad 51 and substrate barrier layer 50 with the resulting aluminum splash features 53, intermetallic contact layer 54, and crevice 55, having optimized structural geometric features to prevent aluminum cracking under the copper ball 52. As illustrated, the bond interface structure 51/54/52 between the copper ball bond 52 and aluminum pad 51 has a generally concave shape with a raised central portion formed with a combination of remnant aluminum 51 and intermetallic contact layer 54 so that the bottom of the copper ball may be characterized by a w-shaped profile. With this profile, an additional geometrical requirement for promoting reliable copper ball bonds is to form copper wirebonds with substantial symmetry between remnant connection pad layer thicknesses on first and second opposed sides of a squashed copper ball bond. In FIG. 5, first and second remnant thicknesses of the minima feature on opposed sides of the copper ball bond $T_{REMNANT-1}$, $T_{REMNANT-2}$ may be measured between the top of the substrate barrier layer 50 and the bottom of the squashed ball bond 52, thereby measuring the height of the remnant aluminum or INIC layer at the high stress connection points Z1, Z2. To provide a reliable copper ball bond, the thickness of the thinner remnant layer (e.g., $T_{REMNANT-1}$ at the minima location Z1) is kept within a predetermined percentage (e.g., 70%) of the thickness of the relatively thicker remnant layer (e.g., $T_{REMNANT-2}$). Stated computationally, $T_{REMNANT-1}/T_{REMNANT-2} \geq 0.7$). To achieve a higher level of thermal reliability performance, such as the AEC Grade 0 automotive test standards, the relative symmetry is increased (e.g., $T_{REMNANT-1}/T_{REMNANT-2} \geq 0.8$). In selected embodiments, a highly reliable copper ball bond requires that, on both sides of a ball bond, substantially symmetrical minima features are positioned in or past the outer half of the chamfer region and limited to a maximum target thickness (e.g., $T_{REMNANT} \leq 0.1$-$0.2$ um), depending on the testing requirements.

Figure 6:
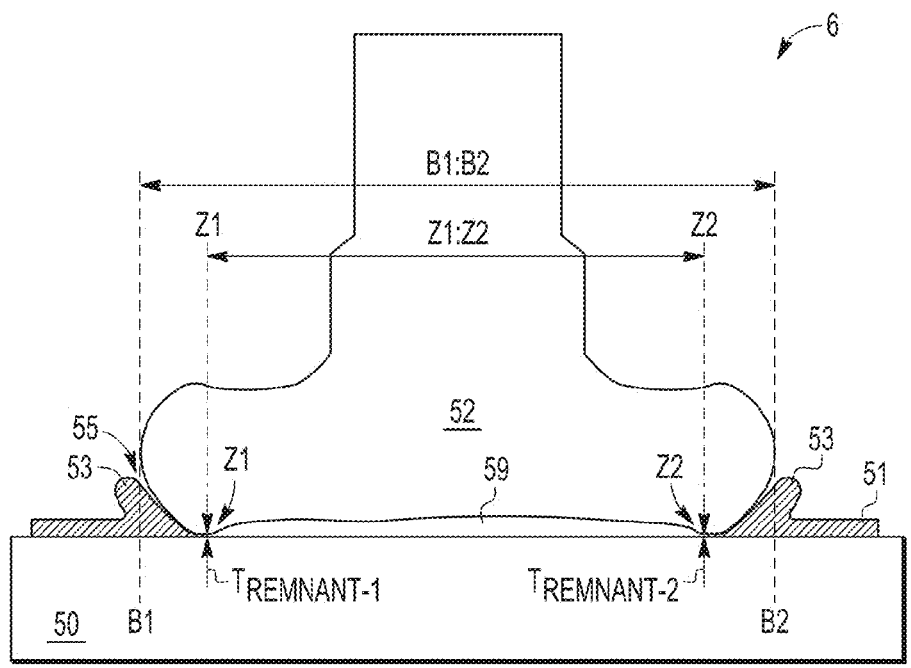

As will be appreciated, the interface structure between the copper ball bond 52 and aluminum pad 51 will change over the thermal life of the bond as the remnant aluminum under the copper ball bond 52 is converted to intermetallic contact layer. To illustrate this change in the bond interface structure, reference is now made to FIG. 6 which shows a schematic cross section view 6 of the copper ball bond shown in FIG. 5 wherein the bond interface structure 59 between the copper ball bond 52 and aluminum pad 51 is formed with intermetallic contact layer that has been formed from the remnant aluminum 51 so that the bottom of the copper ball may be characterized by a w-shaped profile. As illustrated, the first and second remnant thicknesses of the minima feature on opposed sides of the copper ball bond $T_{REMNANT-1}$, $T_{REM-}$ $_{NANT-2}$ maintain their relative symmetry, even when the remnant aluminum has been converted to the intermetallic contact layer 59.

In addition or in the alternative, the bonding parameters may be controlled to provide an extended intermetallic contact area relative to the squashed ball bond area. In selected example embodiments, the extended intermetallic contact area may be characterized as a specified geometric structural bond feature whereby the intermetallic contact length is at least a predetermined percentage of the squashed ball bond diameter. To illustrate selected embodiments of the extended intermetallic contact area feature for a reliable copper ball bond, FIG. 5 shows that the intermetallic contact length Z1:Z2 may be defined as the distance between the minima points Z1, Z2 of the bond interface structure. In addition, the horizontal line B1:B2 may define the length or outer diameter of the squashed ball bond 52. With these measurements, an additional geometrical requirement for promoting reliable copper ball bonds is to form copper wirebonds with an intermetallic contact area or length that is within a predetermined percentage (e.g., 65-80%) of the squashed ball bond area or outer diameter. To provide a reliable copper ball bond, an extended contact area for IMC growth (characterized by the dimensional measure Z1:Z2) is at least 65% of the largest squashed ball bond area (characterized by the dimensional measure B1:B2). In other words, (Z1:Z2)≥0.65(B1:B2). To achieve a higher level of thermal reliability performance, such as the AEC Grade 0 automotive test standards, the relative IMC contact length Z1:Z2 is increased (e.g., (Z1:Z2) ≥0.80(B1:B2)). In selected embodiments, a highly reliable copper ball bond requires that an extended IMC contact length Z1:Z2 extends across the ball bond between substantially symmetrical minima features Z1, Z2 that are positioned in or past the outer half of the chamfer region and limited to a maximum target thickness (e.g., $T_{REMNANT}$≤0.1-0.2 um), depending on the testing requirements.

Figure 7:
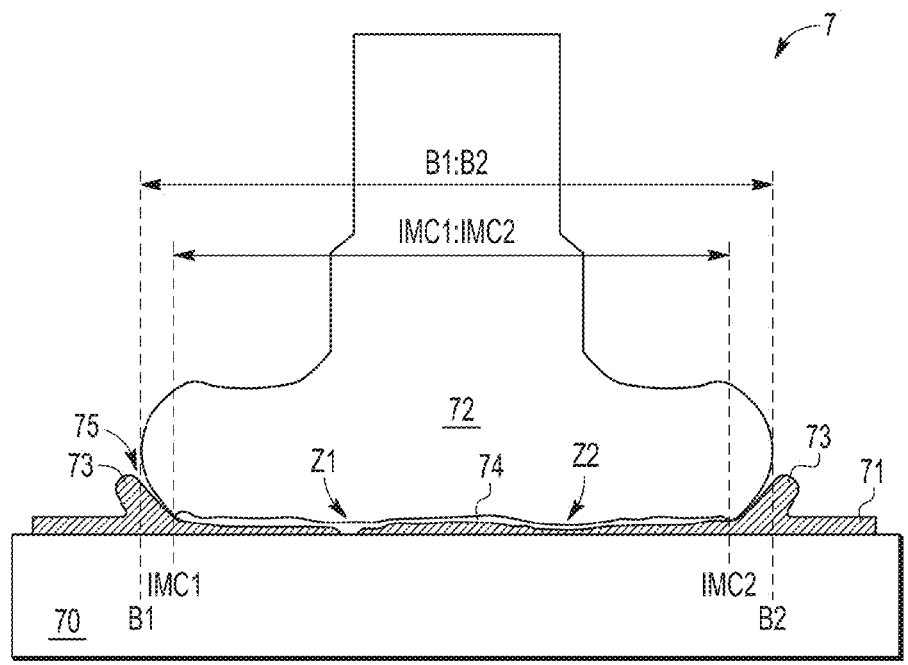
FIG. 7-8 show schematic cross sections of a copper ball having a second specified shape type that is bonded to an aluminum pad to illustrate structural geometric features optimized to prevent aluminum cracking under the copper ball in accordance with selected embodiments of the present disclosure.

In some cases, the profile of the bond interface structure does not readily provide a way to determine the length of the intermetallic contact layer. For example, FIG. 7 shows a schematic cross section view 7 of a copper ball 72 bonded to an aluminum pad 71 and substrate barrier layer 70 with the resulting aluminum splash features 73, intermetallic contact layer 74, and crevice 75, having optimized structural geometric features to prevent aluminum cracking under the copper ball 72. As illustrated, the bond interface structure 71, 74 between the copper ball bond 72 and aluminum pad 71 has a generally convex shape with a thinner central portion formed with a combination of remnant aluminum 71 and intermetallic contact layer 74 so that the bottom of the copper ball may be characterized by a u-shaped profile. In such cases, the bonding parameters may be controlled to form an extended intermetallic contact area as a specified geometric structural bond feature whereby the intermetallic contact length is at least a predetermined percentage of the squashed ball bond diameter. In FIG. 7, the intermetallic contact length IMC1: IMC2 may be defined as the horizontal distance between the starting points for IMC formation 74 on each end of the bond interface structure. In addition, the horizontal line B1:B2 may define the length or outer diameter of the squashed ball bond 72. With these measurements, an additional geometrical requirement for promoting reliable copper ball bonds is to form copper wirebonds with an intermetallic contact area or length that is within a predetermined percentage (e.g., 65-80%) of the squashed ball bond area or outer diameter. To provide a reliable copper ball bond, an extended contact area for IMC growth (characterized by the dimensional measure IMC1:IMC2) is at least 65% of the largest squashed ball bond area (characterized by the dimensional measure B1:B2). In other words, (IMC1:IMC2)≥0.65(B1:B2). To achieve a higher level of thermal reliability performance, such as the AEC Grade 0 automotive test standards, the relative IMC contact length IMC1:IMC2 is increased (e.g., (IMC1:IMC2) ≥0.80(B1:B2)). In selected embodiments, a highly reliable copper ball bond requires that an extended IMC contact length IMC1:IMC2 extends substantially across the ball bond. A bond interface structure characterized by such a geometric feature (e.g., extended IMC contact length) will provide a suitably reliable copper ball bond to the aluminum pad even when the bond interface structure does not have substantially symmetrical minima features Z1, Z2 that are positioned in or past the outer half of the chamfer region and limited to a maximum target thickness.

Figure 8:
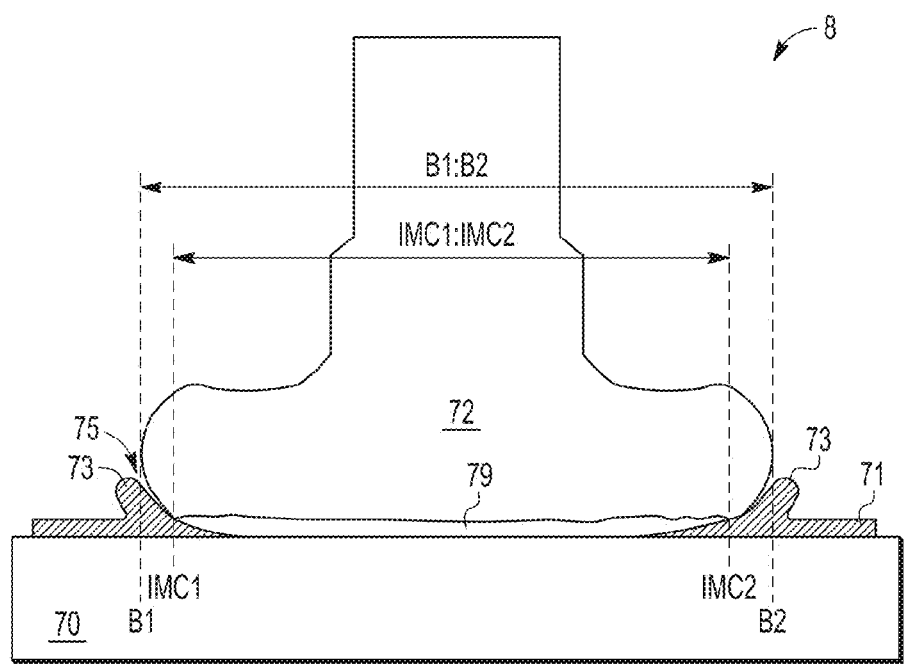

As will be appreciated, the interface structure between the copper ball bond 72 and aluminum pad 71 will change over the thermal life of the bond as the remnant aluminum under the copper ball bond 72 is converted to intermetallic contact layer. To illustrate this change in the bond interface structure, reference is now made to FIG. 8 which shows a schematic cross section view 8 of the copper ball bond shown in FIG. 7 wherein the bond interface structure 79 between the copper ball bond 72 and aluminum pad 71 is formed with intermetallic contact layer that has been formed from the remnant aluminum 71 so that the bottom of the copper ball may be characterized by a u-shaped profile. As illustrated, the extended IMC contact length IMC1:IMC2 extends across the ball bond, preferably extending at least 65 percent of the largest dimensional diameter measure B1:B2 for the copper ball bond 72.

In addition or in the alternative, the bonding parameters may be controlled to provide a reliable copper ball bond by controlling the squashed ball bond height (SBBH) relative to its width or diameter (SBBD), alone or in combination with specifying a ball shear strength test measure for a selected sample set. In selected example embodiments, the squashed ball bond height and diameter dimensions may be characterized as a specified geometric structural bond feature whereby the squashed ball bond height is no bigger than a predetermined percentage of the squashed ball bond diameter. To illustrate selected embodiments of the squashed ball bond feature for a reliable copper ball bond, FIG. 1 shows that the squashed ball bond diameter in the x and y directions SBBDx, SBBDy may be defined as the central diameter of the squashed ball bonds 14a-c. FIGS. 5-8 also illustrate squashed ball bond diameter measures as the horizontal line B1:B2 defined by the length or outer diameter of the squashed ball bond. The diameter measure(s) may be determined using an optical scope or other measurement tool. From the x and y diameter measures SBBDx, SBBDy, the average squashed ball bond diameter (SBBD) may be calculated. In similar fashion, the squashed ball bond height SBBH may be measured between the top and bottom of the squashed ball bonds 14a-c. In selected embodiments, the bonding process parameters are applied to form a reliable copper ball bond by controlling the squashed ball height (SBBH) to be less than or equal to a predetermined percentage (e.g., 35%) of the squashed ball width (SBBD), thereby forming a short and fat squashed ball.

Figure 9:
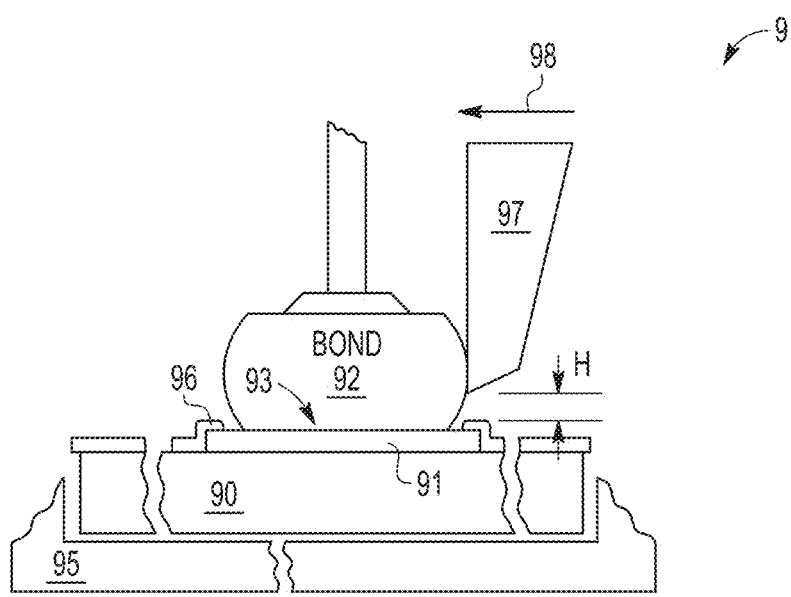
FIG. 9 illustrates a bump shear test arrangement for testing the mechanical integrity and ball shear strength of copper wirebonds bonded to aluminum bond pads.

To evaluate the ball shear strength of the copper ball bonds formed with one or more of the specified structural and geometric requirements disclosed herein, a ball shear strength test measure is specified for identifying copper ball bonds which meet or exceed a minimum threshold value of the ball shear strength/area measure. In accordance with selected embodiments, the ball shear test evaluates the mechanical integrity of the aluminum and/or intermetallic compound layer below the copper ball bond by setting the parameters of the ball shear process (such as the shear knife speed, height, etc.) so that the shear knife is aimed at the middle or midpoint of the copper ball bond to provide detailed and accurate information about the copper ball bond robustness on almost any location on a die. Once the bump shear test procedures are calibrated, the load curve and maximum load recorded on the bump shear system may be analyzed to characterize the material properties of the copper ball bond. An example will now be described with reference to FIG. 9 which shows a cross' sectional view 9 of a bump shear test structure for testing the mechanical integrity and ball shear strength of copper wirebonds bonded to aluminum bond pads. As illustrated, a copper bond ball 92 is bonded to the aluminum bond pad 91 at a bond interface structure 93 which defines the bond weld area. The aluminum bond pad is formed on the test die 90 and surrounded by a passivation layer 96 in which an opening exposes the aluminum bond pad 91, all of which are secured by a clamp structure 95. During the ball shear test, a shearing arm 97 is positioned for lateral movement against the copper bond ball 92 so as to intersect with the center line or middle portion of the copper bond ball 92. As illustrated, the positioning of the shearing arm 97 is controlled so that the bottom of the shearing arm 97 is positioned above the passivation layer 96 by a minimum spacing distance h which permits the shearing arm 97 to intersect with the center line of the copper ball bond 92. For example, if a copper ball bond 92 has a height of 18 μm, the shearing arm 97 may be positioned at a height of 5 μm to directly apply its force to the copper bond ball 92, thereby providing much meaningful information about the integrity of the remnant aluminum or IMC layer in the aluminum bond pad 91 area.

In performing the ball shear test on a squashed ball bond, the ball shear strength is recorded in gram (force) units, and a plurality of ball shear test results for a sample size of squashed ball bonds (e.g., 48) is used to calculate an average ball shear strength value. In addition, a squashed ball area is computed, such as by using the average squashed ball bond diameter (SBBD). By dividing the computed average ball shear strength value by the squashed ball area, an average ball shear per squashed ball area (BSPA) metric may be derived. For example, BSPA=(Average Ball Shear Strength Value)/($\pi$ (SBBD/2)2).

By performing bump shear tests on multiple copper bond balls on a die, the differences in maximum load and characteristics of the load curves may be used to evaluate and compare the copper bond balls in terms of mechanical integrity, yield and other qualitative measures. This makes it possible to provide rapid feedback to the die manufacturing facility without running time-consuming package tests and qualifications. In addition, the disclosed bump shear test structure and methodology may be used to monitor the mechanical integrity of the remnant aluminum or IMC layer under copper bond ball. Thus, the disclosed test structure and method is ideal for packaging development and monitoring product quality, especially for copper ball bonds formed on aluminum connection pads over low-k dielectric layers as part of a multi-level interconnect stack (e.g., 6-7 back end of line (BEOL) interconnect levels) under which active circuitry is located. The disclosed test structure and method may also be used to form smaller ball bonds with improved temperature cycling reliability (e.g., a ball shear strength per area measure of at least 7.5 gf/mil$^2$) so that smaller ball bond structures (e.g., wire diameters of approximately 25 microns and ball diameters of approximately 55 microns) can be bonded to aluminum pads formed on low-k dielectric layers over active circuits. These improvements in ball shear strength are beneficial with multi-level interconnect stacks formed with low-k dielectric layers which are more susceptible to cracking, especially when active circuits are formed beneath the copper ball bond.

To provide a reliable copper ball bond, the bonding parameters may be controlled to confine the ratio of the average squashed ball bond height (SBBH) to the average squashed ball bond diameter (SBBD) to be no larger than 0.35, and to form one or more specified geometric structural bond features disclosed herein such that the computed average ball shear per squashed ball area (BSPA) metric is at or above at predetermined threshold value. For example, to provide a reliable copper ball bond, the ratio of SBBH/SBBD≤0.35, and the minimum threshold value for the computed BSPA metric≥7.5 gf/mil$^2$, assuming that the average squashed ball bond diameter dimension is converted to mil units (1 um=0.03937 mil). To achieve an even higher level of temperature cycling reliability performance, such as the AEC Grade 0 automotive test standards, the minimum threshold value for the BSPA metric≥9.0 gf/mil$^2$. In selected embodiments, a highly reliable copper ball bond requires that a plurality of the specified geometric structural bond features are formed to have a ball shear strength/area measure that meets or exceeds a minimum threshold value (e.g., 7.5-9 gf/mil$^2$), depending on the testing requirements.

Figure 10:
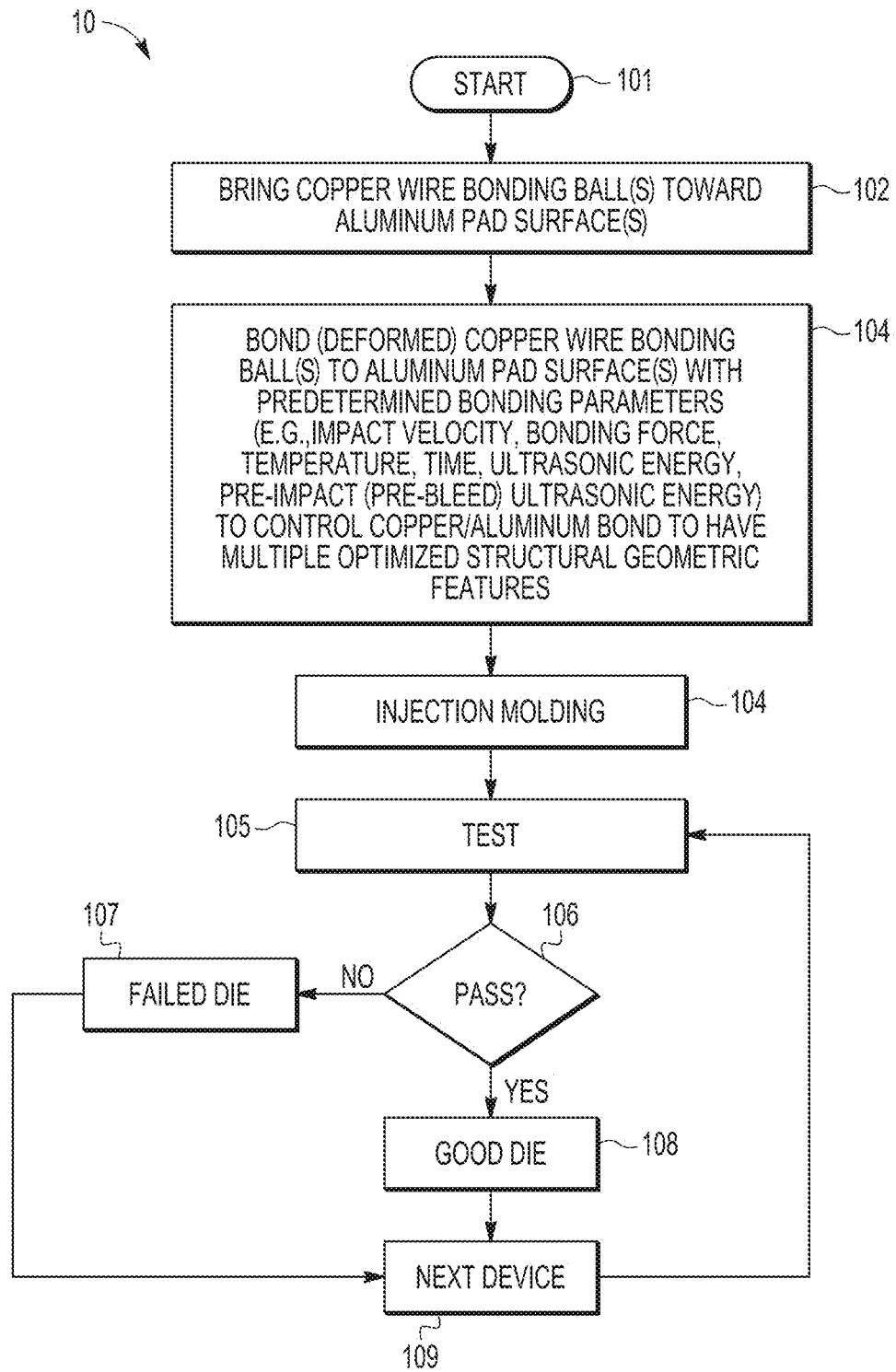
FIG. 10 is a simplified schematic flow chart illustrating various methods for fabricating and testing copper ball bonds for a reliable ball bond-pad attachment.

To further illustrate selected embodiments of the present invention, reference is now made to FIG. 10 which is a simplified schematic flow chart 10 illustrating various methods for fabricating and testing copper ball bonds for a reliable ball bond-pad attachment in accordance with selected embodiments of the invention. In describing the fabrication methodology, the description is intended merely to facilitate understanding of various exemplary embodiments and not by way of limitation. Unless otherwise indicated, the steps may be provided in any desired order. Since the steps illustrated in FIG. 10 and described below are provided by of example only, it will be appreciated that the sequence of illustrated steps may be modified, reduced or augmented in keeping with the alternative embodiments of the disclosure so that the method may include additional steps, omit certain steps, substitute or alter certain steps, or perform certain steps in an order different than that illustrated in FIG. 10, Thus, it will be appreciated that the methodology of the present invention may be thought of as performing the identified sequence of steps in the order depicted, though the steps may also be performed in parallel, in a different order, or as independent operations that are combined.

Once the methodology starts (step 101), the copper wire is brought towards the aluminum pad surface to initiate the bonding process (step 102). The copper wire typically includes bonding ball is formed at an end of a bonding wire that may be applied by a capillary bonding tool in selected embodiments, a Free Air Ball (FAB) may be formed on the end of the copper wire from the plasma formed by the spark ignited by the Electronic Flame Off (EFO) system. As the copper bonding ball contacts the aluminum pad surface, the shape of the copper bonding ball may be deformed by the applied bonding force, or alternatively, the desired shape of the copper bonding ball may be preformed or mechanically conditioned beforehand.

At step 103, the copper wire bonding balls are bonded directly to the aluminum pad surface layer using predetermined bonding parameters to control the bonding interface structure between the copper ball and aluminum pad to include one or more optimized geometric structural bond features for promoting temperature cycling reliability, By properly selecting and controlling the bonding parameters as a combination of impact velocity, bonding force, temperature, time, pressure, pre-impact (aka, pre-bleed) ultrasonic energy, and ultrasonic energy to form an intermetallic connection or weld between the copper ball and aluminum connection pad, the resulting bonding interface structure will have one or more optimized structural and geometric requirements relating to the positioning, thickness and symmetry of the minimum remnant aluminum layers beneath the bonded copper ball, the relative width or length of the intermetallic contact area, and/or a specified height-to-diameter ratio for the squashed ball to increase an average ball shear strength per ball area test measure. For example, selected bonding parameters are controlled to prevent cracking of the aluminum or INK material under the copper ball by forming symmetrical minima features (e.g., aluminum remnant) in the connection pad layer or inter-metallic compound (IMC) layer that are located in or past the outer half of the chamfer-squeezed region, that have a specified maximum remnant thickness, and that have a relatively symmetrical thickness. Copper ball bonding reliability is also promoted by controlling the selected bonding parameters to form an extended intermetallic contact area relative to the squashed ball bond area by requiring that the intermetallic contact length meet a predetermined minimum percentage of the squashed ball bond diameter, thereby ensuring a large contact area for IMC growth. Copper ball bonding reliability is also promoted by controlling the squashed ball height to be less than a predetermined maximum percentage of the squashed ball width to form a short and fat squashed ball, where the resulting bond strength may be evaluated by computing a ball shear per area (BSPA) measure for comparison to a minimum threshold value for the computed BSPA metric.

In an example embodiment where the selected bonding parameters at step 103 are optimized for an KnS Iconn wire bonder to form reliable copper ball bonds to an aluminum bond pad (99.5% Al+0.5 wt % Cu) having a thickness of 1.2 um with bond pad opening of 50 um as the smallest side is shown below:
   a. The bonding temperature is 145-155° C. (or more specifically 150° C.) as preheat, 165-175° C. (or more specifically 170° C.) at bonding temperature and post bond temperature 145-155° C. (or more specifically 150° C.);
   b. USG pre-bleed (USG current, mA): 40-50 mA (or more specifically 45 mA);
   c. Bonding power (USG current, mA): 65-75 mA (or more specifically 70 mA);
   d. Initial bonding force: 15-25 g (or more specifically 20 g);
   e. Bonding force: 20-30 g (or more specifically 25 g); and
   f. Bonding time: 10-20 m-sec (or more specifically 15 m-sec).

As will be appreciated, different types of bonding concepts can be used to achieve the various bonding interface structure cases illustrated in the figures. For example, one bonding technique turns on a bonding force with zero bonding power during a first segment, and uses minimal bonding force and optimal bonding power during a second segment. Another bonding technique uses a mid-range bonding power and optimal bonding force during the first segment, and lower bonding force and optimal bonding power during the second segment. It will also be appreciated that effect of the various bonding parameters on achieving the example geometric structures illustrated in the figures will be modulated by the clamping system used to hold the integrated circuit die assembly in the wire bonding system, the material features and properties of the assembly elements, the material features and properties of the copper wire, the bonding temperature, and the capillary material and design. In general, it is best to firmly clamp the assembly as close to the bonding area as possible. The thickness of the die, and the composition, thickness, and hardness of the aluminum bond pad metal affects the resulting copper ball bond. Higher temperatures are commonly used ($\geq 200°$ C.) when copper wire bonding on a metal lead frame assembly, while lower temperatures ($\leq 180°$ C.) are commonly used when copper wire bonding on a printed circuit board substrate assembly. The thickness and physical and mechanical properties of the lead frame metal, and the thickness of individual metal and dielectric layers in the printed circuit board substrate, and properties of these layers, affect heat transfer and attenuation of ultrasonic energy during the bonding process. The copper wire may be an uncoated, high purity copper alloy, or it may be coated with another metal such as palladium, gold, or silver. The physical and mechanical properties of the free air ball (FAB) affect the interaction with the aluminum pad metal. The capillary material and design affects the efficiency of transfer of energy from the capillary to the ball bond during its formation which affects the quality of the bond to the aluminum pad.

Of course, it will be understood that the present invention is not limited to a particular set of bonding parameters. Rather, the optimum bonding parameters are dependent on wire type, pad metallization, device configurations, and other consideration.

Once the bonding of the copper balls and aluminum pads is completed, the individual devices are encapsulated with a transfer mold compounds at step 104. For example, transfer molding may be used to mold thermoset materials by feeding material into a cavity with simple plunger action on the melted thermoset material.

After packaging the integrated circuit device, the integrated circuit device may be tested at step 105, either with a stress test or a visual test to evaluate the geometric structures of the copper ball bond. As will be appreciated, any stress test may be applied, including but not limited to biased HAST, unbiased HAST, THB, autoclave, and temperature cycling testing. In addition or in the alternative, it will be appreciated that inspection and testing of the copper ball bond geometric features may be performed after bonding of the copper balls and aluminum pads is completed and before molding. If performed after molding, the transfer mold compound must be removed with acids or other removal techniques. In addition or in the alternative, the various geometric structural features described herein may be assessed by use of standard tools and procedures for failure analysis of semiconductor devices, to measure aspects of the optimized geometric structural bond features in the bonding interface structure formed between the copper ball and aluminum pad. Next, the test results are assessed at step 106.

In accordance with selected embodiments, the test criteria applied at step 105 assess the integrated circuit copper wire bond connection to determine if one or more geometric features are present which are indicative of thermal cycling reliability. For example, a copper ball bond may fail to meet an AEC Grade 1 (1000 cycles of temperature cycling from −50° C. to 150° C.) test when the aluminum minima feature on one side is located in or past the outer half of the chamfer-squeezed region, but the aluminum minima feature on the opposite side is not located in or past the outer half of the chamfer-squeezed region. In addition or in the alternative, a copper ball bond may pass an AEC Grade 0 (2000 cycles of temperature cycling from −50° C. to 150° C.) test when the aluminum minima features on both sides are properly located in or past the outer half of the chamfer-squeezed region and a computed ball shear strength per area metric meets or exceeds a specified minimum threshold value for the computed BSPA metric. In addition or in the alternative, a copper ball bond may fail an AEC Grade 0 (2000 cycles of temperature cycling from −50° C. to 150° C.) test when the aluminum minima feature on both sides are properly located in or past the outer half of the chamfer-squeezed region but the computed ball shear strength per area metric does not meet or exceed the specified minimum threshold value for the computed BSPA metric.

As will be appreciated, any desired test criteria may be applied at step 105. For example, wire pull testing or bond pull testing may be applied to test for wire bond strength and quality. Typically, wire pull tests may be applied to a sample size of ball bonds by applying an upward force under the wire to be tested to pull the wire away from the die. Wire/bond pull testing may be implemented with pull tester equipment which includes a mechanism for applying the upward pulling force on the wire/bond using a tool known as a pull hook, and a calibrated instrument for measuring the force at which the wire/bond eventually breaks. This breaking force is usually expressed in grams-force. Instead of breaking on the copper wire, the copper ball would lift off of the aluminum bond pad, taking along some portion of the aluminum bond pad and leaving behind some other portion of the aluminum bond pad.

Figure 11:
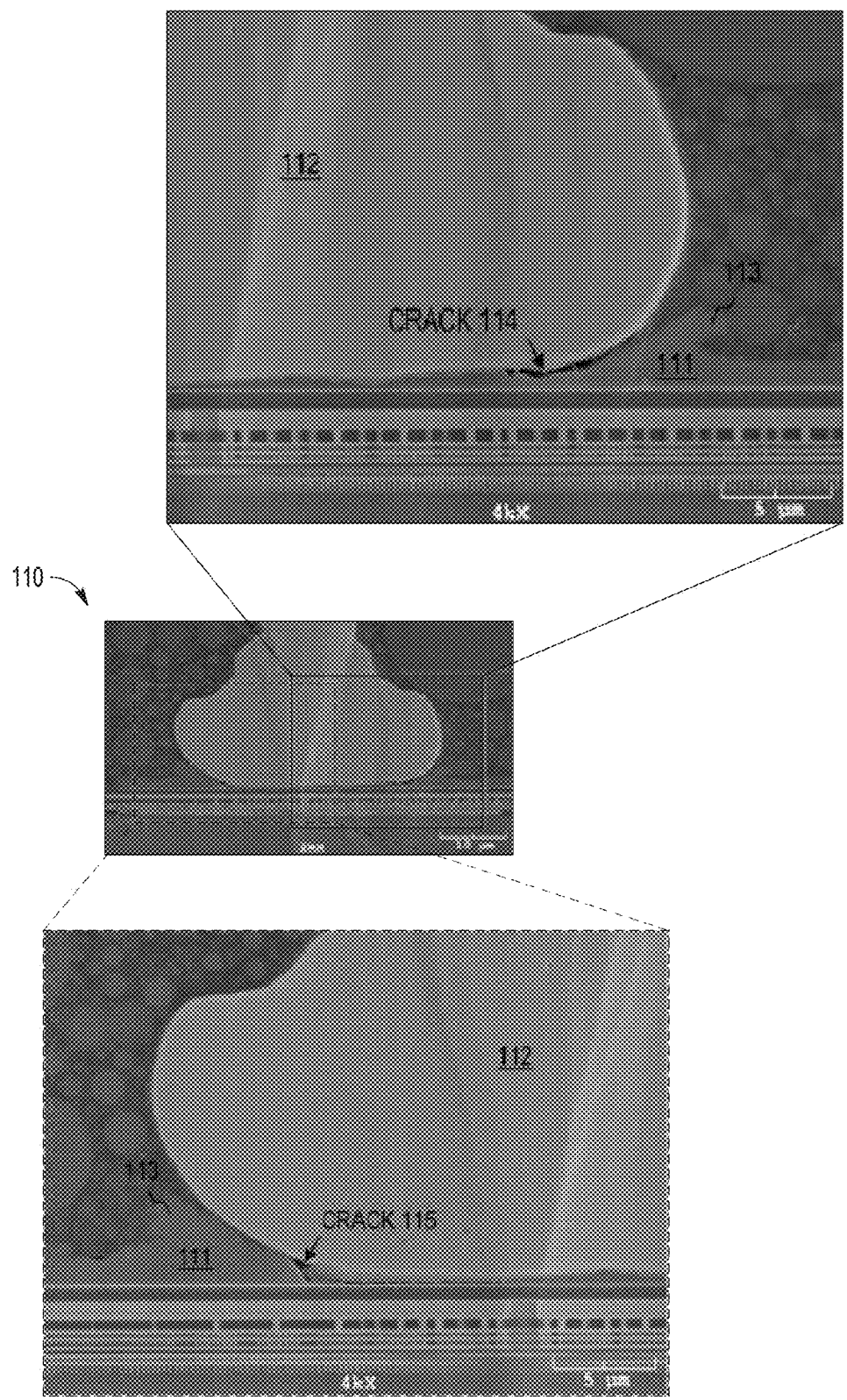
FIG. 11 is a cross-sectional image of a copper ball bond having a bond interface structure in which aluminum cracks are formed at the ball edges after temperature cycling has occurred.
Figure 12A:
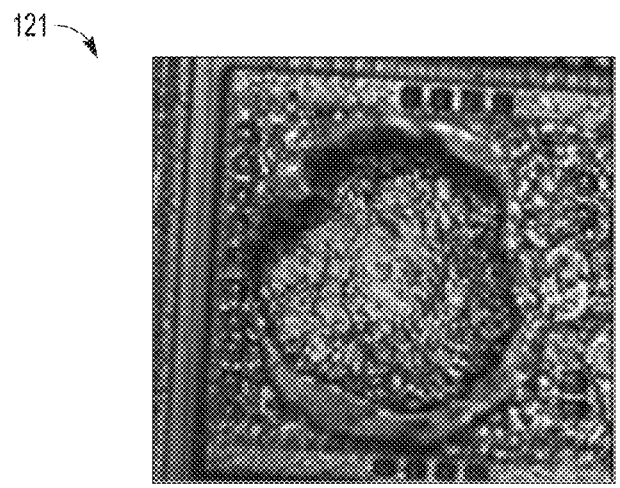
FIGS. 12(a)-(c) are optical photos of an aluminum bond pad and the bottom of the copper ball after the copper ball is pulled away during a wire pull test.
Figure 12B:
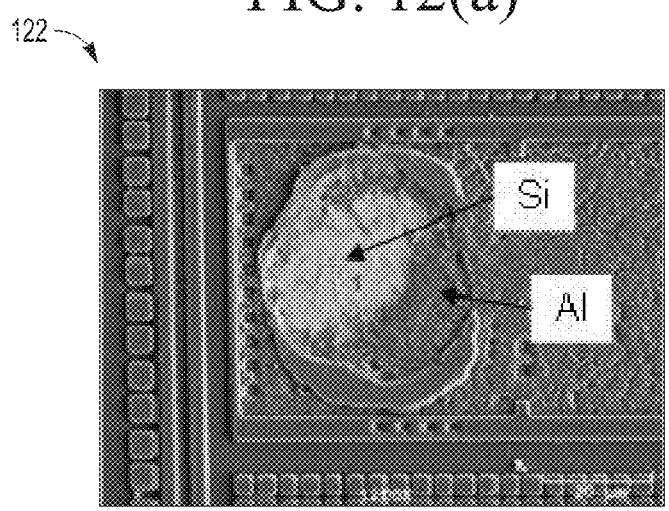
Figure 12C:
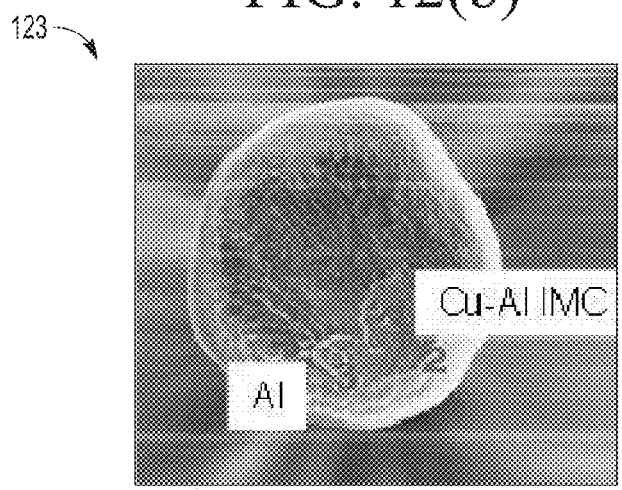

If the integrated circuit device passes 108 (affirmative outcome to decision 106), the next device may be selected (step 109) for application of the test (step 105). However, if the integrated circuit device fails the test 107 (negative outcome to decision 106), and the test may then be performed on the next device (step 109). To provide illustrative examples of copper ball bond test failures, reference is now made to FIG. 11 which shows a cross-sectional image 110 of a copper ball bond. As shown in the enlarged images, the copper ball 112 is bonded to an aluminum bond pad 111 to form an aluminum splash features 113 and bond interface structure in which aluminum cracks 114, 115 have been formed to propagate inwardly from the ball edges after temperature cycling has occurred. Another illustration of a copper ball bond test failure is provided in FIGS. 12(*a*)-(*c*) which show optical photos of the aluminum bond pad and the bottom or foot of the copper ball after a wire pull test. In particular, FIG. 12(*a*) is an optical photo 121 of the aluminum bond pad after the copper ball is pulled away during a wire pull test, revealing the exposed substrate semiconductor which is surrounded by the remnant aluminum splash feature that remains on the aluminum bond pad by virtue of the crack formed in the aluminum material. In particular, FIG. 12(*b*) is an SEM photo 122 of the aluminum bond pad after the wire pull test is applied, showing that the underlying silicon substrate is exposed by an opening formed in the aluminum bond pad. In addition, FIG. 12(*c*) is an SEM photo 123 of the bottom or foot of the copper ball bond after the wire pull test is applied, showing that aluminum and copper-aluminum inter-metallic compound (IMC) remains on the bottom of the copper ball bond. As shown in these example images, the test failure is indicated by the presence of the aluminum layer on both the bond pad and the foot of the copper ball, indicating that aluminum cracks were formed therebetween after temperature cycling. Selected embodiments of the present disclosure reduce or eliminate such failures by forming copper ball bond interface structures on low-k dielectric layers to have specified geometric features to provide a specified minimum ball shear strength per area measure for the copper ball bonds.

By now it should be appreciated that there is provided herein an integrated circuit copper wire bond connection and method for manufacturing same. As disclosed, the copper wire bond connection includes a copper ball that is bonded directly to an aluminum bond pad formed on a low-k dielectric layer to form a bond interface structure for the copper ball characterized by a first plurality of geometric features to provide thermal cycling reliability, including an aluminum minima feature located at an outer peripheral location under the copper ball to prevent formation and/or propagation of cracks in the aluminum bond pad. In the copper wire bond connection, the aluminum bond pad may be formed with a metallic material having a modulus measure of stiffness that is less than or equal to a 60% of a modulus measure of a metallic material used to form the copper ball. In selected embodiments, the aluminum minima feature of the bond interface structure has a thickness that is less than 0.2 microns, and in other embodiments, the aluminum minima, feature has a thickness that is less than 0.1 microns. As formed, the aluminum minima feature may be located in or past an outer half of a chamfer-squeezed region in the copper ball at a high stress connection point between the copper ball and aluminum bond pad. In addition or in the alternative, the aluminum minima feature may be characterized by having substantially symmetrical thickness on opposed sides of the copper ball. For example, the aluminum minima feature may have a first larger thickness on a first side of the copper ball and a second smaller thickness on a second, opposite side of the copper ball, where second smaller thickness is at least 70% of the first larger thickness. In addition or in the alternative, the geometric features for the bond interface structure may include forming an inter-metallic compound (IMC) layer having a total length that is at least 65-85% of a diameter measure for the copper ball. In addition, the copper ball may be deformed in the bonding process to have a height dimension that is less than 35% of a diameter measure for the copper ball. As formed, the integrated circuit copper wire bond connection is characterized by a ball shear strength per area measure of at least 7.5 gf/mil2.

In another form, there is provided a method of forming a copper ball bond to an aluminum pad. As an initial step, a bonding wire is formed that includes a copper ball, and the copper ball is then positioned at a bonding site at an aluminum bond pad formed on a low-k dielectric layer, Thereafter, the copper ball is bonded to an aluminum bond pad with a predetermined combination of heat, pressure and ultrasonic vibration energy applied in a first direction. In an example implementation, the combination of heat, pressure and ultrasonic vibration energy includes preheating the bonding wire an copper ball to a preheat temperature of approximately is 150° C.; and heating the copper ball and aluminum bond pad to a bonding temperature of approximately 170° C. when bonding the copper ball to the aluminum bond pad while supplying bonding power current of approximately 45 mA and applying a bonding force of approximately 20 g during the first segment and supplying bonding power current of approximately 70 mA and applying a bonding force of approximately 25 g during the second segment for a bonding time of approximately 15 msec. As a result, a bond interface structure between the copper ball and aluminum bond pad characterized by a first plurality of geometric features to provide thermal cycling reliability comprising an aluminum minima feature located at an outer peripheral location under the copper ball to prevent aluminum bond pad crack formation or propagation. For example, the geometric features for the bond interface structure may include an aluminum minima feature that has a thickness that is less than 0.2 microns, or even less than 0.1 microns. In other embodiments, the aluminum minima feature of the bond interface structure may be located in or past an outer half of a chamfer-squeezed region in the copper ball and is characterized by having substantially symmetrical thickness on opposed sides of the copper ball. In addition, the geometric features for the bond interface structure may include an inter-metallic compound (IMC) layer having a total length that is at least 65% of a diameter measure for the copper ball, or at least 80% of the diameter measure. As a result, the copper ball bond to the aluminum pad may be characterized by a ball shear strength per area measure of at least 7.5 gf/mil$^2$, or at least 9 gf/mil$^2$.

Although the described exemplary embodiments disclosed herein are directed to various geometric features and structures for the bonding interface structure between the copper ball and aluminum pad and methods for making same, the present invention is not necessarily limited to the example embodiments which illustrate inventive aspects of the present invention that are applicable to a wide variety of transistor fabrication processes and/or structures. For example, the direct bonding of copper bond balls to aluminum connection pads provides equivalent or superior reliability to gold wire bonding to the same package because the copper-aluminum intermetallic is thinner and more robust than the gold-aluminum intermetallic, but selected embodiments may also form reliable bonds with noble metal doped copper wires when the ball bond geometric shape is properly controlled to form aluminum splash structures. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit copper wire bond connection comprising:
   a copper ball bonded to an aluminum bond pad formed on a low-k dielectric layer to form a bond interface structure for the copper ball characterized by a first plurality of geometric features comprising substantially symmetrical minima features located on opposed outer peripheral locations under the copper ball to provide a ball shear strength per area measure of at least 7.5 gf/mil$^2$.

2. The integrated circuit copper wire bond connection of claim 1, where the aluminum bond pad is formed with a metallic material having a modulus measure of stiffness that is less than or equal to a 60% of a modulus measure of a metallic material used to form the copper ball.

3. The integrated circuit copper wire bond connection of claim 1, where each minima feature of the bond interface structure has a thickness that is less than 0.2 microns.

4. The integrated circuit copper wire bond connection of claim 1, where each minima feature of the bond interface structure has a thickness that is less than 0.1 microns.

5. The integrated circuit copper wire bond connection of claim 1, where each minima feature of the bond interface structure is located in or past an outer half of a chamfer-squeezed region in the copper ball at a high stress connection point between the copper ball and aluminum bond pad.

6. The integrated circuit copper wire bond connection of claim 1, where each minima feature of the bond interface structure comprises an aluminum minima feature or an inter-metallic compound layer minima feature.

7. The integrated circuit copper wire bond connection of claim 1, where the substantially symmetrical minima features comprise a first minima feature having a first larger thickness on a first side of the copper ball and a second minima feature having a smaller thickness on a second, opposite side of the copper ball, where second smaller thickness is at least 70% of the first larger thickness.

8. The integrated circuit copper wire bond connection of claim 1, where the first plurality of geometric features for the bond interface structure comprises an inter-metallic compound (IMC) layer having a total length that is at least 65% of a diameter measure for the copper ball.

9. The integrated circuit copper wire bond connection of claim 1, where the first plurality of geometric features for the bond interface structure comprises an inter-metallic compound (IMC) layer having a total length that is at least 80% of a diameter measure for the copper ball.

10. The integrated circuit copper wire bond connection of claim 1, where the copper ball has a height dimension that is less than 35% of a diameter measure for the copper ball.

11. The integrated circuit copper wire bond connection of claim 1, where the copper ball has a diameter of substantially 55 microns or less, and is integrally attached to a wire conductor having a diameter of substantially 25 microns or less.

12. The integrated circuit copper wire bond connection of claim 1, where the integrated circuit copper wire bond connection is characterized by a ball shear strength per area measure of at least 9 gf/mil$^2$.

13. The integrated circuit copper wire bond connection of claim 1, where the copper ball is attached to the aluminum bond pad by applying ultrasonic vibration energy to the copper ball in a first direction.

14. The integrated circuit copper wire bond connection of claim 1, where one or more active circuits are located directly underneath the integrated circuit copper wire bond connection.

15. A method of forming a copper ball bond to an aluminum pad, comprising:
   forming a bonding wire comprising a copper ball;
   positioning the copper ball at a bonding site at an aluminum bond pad formed on a low-k dielectric layer;
   bonding the copper ball to an aluminum bond pad with a predetermined combination of heat, pressure and ultrasonic vibration energy applied in a first direction to form a bond interface structure between the copper ball and aluminum bond pad characterized by a first plurality of geometric features comprising an substantially symmetrical minima features located on opposed an outer peripheral locations under the copper ball to provide a ball shear strength per area measure of at least 7.5 gf/mil$^2$.

16. The method of claim 15, where bonding the copper ball to the aluminum bond pad with the predetermined combination of heat, pressure and ultrasonic vibration energy is performed in wire bonder process comprising:

preheating the bonding wire an copper ball to a predetermined preheat temperature; and heating the copper ball and aluminum bond pad to a bonding temperature above the predetermined preheat temperature when bonding the copper ball to the aluminum bond pad while supplying bonding power current of approximately 40-50 mA and applying a first bonding force of approximately 15-25 g during the first segment and supplying bonding power current of approximately 65-75 mA and applying a second bonding force that is larger than the first bonding force during the second segment for a bonding time of approximately 10-20 msec.

17. The method of claim 15, where each minima feature of the bond interface structure has a thickness that is less than 0.2 microns.

18. The method of claim 15, where each minima feature of the bond interface structure comprises an aluminum minima feature or an intermetallic compound layer minima feature.

19. The method of claim 15, where the first plurality of geometric features for the bond interface structure comprises an inter-metallic compound (IMC) layer having a total length that is at least 65% of a diameter measure for the copper ball.

20. The method of claim 15, where the copper ball bond to the aluminum pad is characterized by a ball shear strength per area measure of at least 9 gf/mil$^2$.

* * * * *

UNITED STATES PATENT AND TRADEMARK OFFICE
CERTIFICATE OF CORRECTION

Page 1 of 1

PATENT NO.        : 9,257,403 B2
APPLICATION NO.   : 14/090086
DATED             : February 9, 2016
INVENTOR(S)       : Tu-Anh N. Tran et al.

It is certified that error appears in the above-identified patent and that said Letters Patent is hereby corrected as shown below:

In the Claims

Claim 7, Col. 18, line 22 should read "copper ball, where the second smaller thickness is at least 70% of"

Claim 15, Col. 18, lines 63-64 should read "geometric features comprising substantially symmetrical minima features located on opposed outer"

Claim 16, Col. 19, line 5 should read "preheating the bonding wire and copper ball to a predeter-"

Signed and Sealed this
Tenth Day of May, 2016

Michelle K. Lee
*Director of the United States Patent and Trademark Office*